US005581861A

United States Patent [19]

Lee et al.

[11] Patent Number: 5,581,861

[45] Date of Patent: Dec. 10, 1996

[54] METHOD FOR MAKING A SOLID-STATE INK JET PRINT HEAD

[75] Inventors: Steven S. Lee; Gayle W. Miller, both of Colorado Springs, Colo.

[73] Assignees: AT&T Global Information Solutions Company, Dayton, Ohio; Hyundai Electronics, San Jose, Calif.; America & Symbios Logic Inc., Fort Collins, Colo.

[21] Appl. No.: 460,485

[22] Filed: Jun. 2, 1995

Related U.S. Application Data

[62] Division of Ser. No. 11,592, Feb. 1, 1993, Pat. No. 5,459, 501.

[51] Int. Cl.$^6$ .................... H01L 41/22

[52] U.S. Cl. .................... 29/25.35; 29/890.1

[58] Field of Search .................... 29/25.35, 890.1, 29/611, 424; 156/644, 654, 657; 346/140 R; 347/54, 68, 70, 71; 310/328, 347, 349

[56] References Cited

U.S. PATENT DOCUMENTS

| | | | |
|---|---|---|---|
| 3,808,669 | 5/1974 | Mitchner et al. | 29/466 |
| 3,946,398 | 3/1976 | Kyser et al. | 346/1 |
| 4,115,789 | 9/1978 | Fischbeck | 346/140 R |
| 4,233,610 | 11/1980 | Fischbeck et al. | 346/140 R |
| 4,248,823 | 2/1981 | Bader et al. | 264/156 |
| 4,312,008 | 1/1982 | Taub et al. | 346/140 R |
| 4,343,013 | 8/1982 | Bader et al. | 346/140 R |
| 4,376,284 | 3/1983 | Bader et al. | 346/140 R |
| 4,383,264 | 5/1983 | Lewis | 346/140 R |
| 4,415,909 | 11/1983 | Italiano et al. | 346/140 R |
| 4,415,910 | 11/1983 | Reece | 346/240 R |
| 4,418,356 | 11/1983 | Reece | 346/140 R |
| 4,493,137 | 1/1985 | Bader et al. | 29/25.35 |
| 4,766,671 | 8/1988 | Utsumi et al. | 29/848 |
| 5,029,805 | 7/1991 | Albarda et al. | 251/11 |
| 5,229,785 | 7/1993 | Leban | 29/890.1 X |
| 5,265,315 | 11/1993 | Hoisington et al. | 29/25.35 |
| 5,364,743 | 11/1994 | O'Neill | 29/890.1 X |
| 5,500,988 | 3/1996 | Moynihan | 29/25.35 |

FOREIGN PATENT DOCUMENTS 339528A 4/1989 European Pat. Off. .

OTHER PUBLICATIONS

IBM Technical Disclosure Bulletin; Ink on Demand Using Silicon Nozzles; J. M. Brownlow and R. Lane; vol. 19, No. 6, Nov. 1976; pp. 2255–2256.

IBM Technical Disclosure Bulletin; Porous Silicon Tehcnique for Fabricating Drop–on–Demand Ink Jet Structures; L. D. Holland & K. E. Petersen; vol. 22, No. 2, Jul. 1979; pp. 783–784.

*Primary Examiner*—S. Thomas Hughes
*Attorney, Agent, or Firm*—Wayne P. Bailey; Douglas S. Foote

[57] ABSTRACT

An ink-jet print head comprises an ink drive unit formed on a first substrate and an ink reservoir unit formed on a second substrate. The ink drive unit includes a thin film piezoelectric transducer formed on one side of the substrate. The reservoir unit includes an etched cavity in the substrate for forming an ink reservoir, the cavity having an aperture in the base extending through the substrate to form an ink nozzle. The ink drive and ink reservoir units are bonded together with the piezoelectric transducer within the ink reservoir. Activating the transducer expels ink from the reservoir via the ink nozzle.

3 Claims, 9 Drawing Sheets

METHOD FOR MAKING A SOLID-STATE INK JET PRINT HEAD

This is a Division of application Ser. No. 08/011,592, filed Feb. 1, 1993, now U.S. Pat. No. 5,459,501.

1. BACKGROUND OF THE INVENTION

The present invention relates generally to a print head for an ink-jet printer and, in particular, to a print head comprising a bonded assembly of two substrates on which elements of the print head may be formed by processes such as etching or vapor deposition.

2. DESCRIPTION OF THE RELEVANT TECHNOLOGY

A print head for an ink-jet printer typically comprises an array of ink-jet nozzles. Ink is ejected from the nozzles in the form of droplets to form characters on paper or other graphic recording medium. Each nozzle is generally supplied with ink by an ink reservoir. Ink is ejected from the nozzles by pulsing the ink reservoir, for example, by means of a piezoelectric transducer in contact with the reservoir.

The nozzle array may comprise a single straight line of equally spaced nozzles arranged perpendicular to the direction of travel of the print head over the recording medium. Alternatively, the nozzle array may comprise a matrix of nozzles arranged such that when the print head travels across the recording medium, the nozzles form equally spaced rows of dots.

To ensure optimum print quality, the nozzles, in any arrangement, must be accurately spaced with respect to one other. Also, the nozzles must generally be in the same plane, such that each nozzle is at the same distance from the recording medium during printing.

Prior art ink-jet print heads generally are mechanical assemblies of individual nozzles and drives. For example, U.S. Pat. No. 4,418,356 discloses an array of elongated tubular ink reservoirs, in which each reservoir has a nozzle at one end and is surrounded by a piezoelectric transducer sleeve.

The molded print head disclosed in U.S. Pat. No. 4,248,823 has elongated, nozzle-forming tubular reservoirs. The reservoirs are formed by inserting a plurality of rods or fibers into an empty mold in a predetermined pattern, filling the mold with a hardenable synthetic material and, after the material has hardened, withdrawing the rods or fibers, leaving the molded tubular reservoirs and associated nozzles.

A common feature of mechanically assembled ink-jet heads of the type described above is the complicated and precise mechanical alignment of nozzles, or in the case of the molded head, alignment of the rods forming the reservoirs and nozzles. There is a need for a print head which can be fabricated without precise, complicated mechanical assembly and alignment steps.

3. SUMMARY OF THE INVENTION

Objects of the present invention are accomplished by forming an ink-jet print head using semiconductor and electronic circuit manufacturing techniques, such as photolithography, layer deposition, and etching. Photolithographic techniques have been developed for semiconductor and electronic circuit manufacture, such that solid state circuit elements can be routinely, automatically and easily formed and aligned to tolerances of about one micrometer or less. By using such photolithographic methods, the present invention avoids the complicated mechanical alignment and assembly steps involved in building prior art ink-jet print heads.

In a preferred embodiment, a print head manufactured in accordance with the present invention using semiconductor and electronic circuit fabrication techniques and materials comprises first and second semiconductor substrates. At least one cavity is formed to a predetermined depth on a first side of the first substrate, preferably by etching. An aperture is formed in the first substrate extending from the base of the cavity to the second side of that substrate. A thin film pressure transducer, including a vapor deposited layer of a piezoelectric material is formed on the first side of the second substrate. The first and second substrates are bonded together with the first sides thereof in a generally face-to-face relationship such that the thin film pressure transducer is located within the cavity in the first substrate, with the second substrate enclosing the cavity to form an ink reservoir, and with the aperture in the base of the cavity forming an ink nozzle. The pressure transducer provides a means of expelling ink from the ink reservoir through the ink nozzle, and the ink channel provides a means of replenishing the ink reservoir.

Preferably, the first side of the second substrate includes an air chamber enclosed by a top and walls formed by a passivating layer, and the pressure transducer is formed in the air chamber. The pressure transducer includes a first layer of an electrically conductive material formed on the top of the chamber for forming a first electrode, a layer of a piezoelectric material formed on the first electrically-conductive layer, and a second layer of an electrically-conductive material formed on the piezoelectric layer to form a second electrode.

A preferred method for making a ink-jet print head according to the present invention includes providing first and second semiconductor substrates, forming a cavity in a first side of the first substrate, and forming an aperture extending through the first substrate from the base of the cavity to the second side of that substrate. A thin film pressure transducer is formed on the first side of the second substrate. At least one ink channel is etched through the second substrate adjacent the thin film pressure transducer. The first and second substrates are bonded together with the first sides thereof in a generally face-to-face relationship, and with the thin film pressure transducer within the cavity in the first substrate, such that the second substrate encloses the cavity to form an ink reservoir, the aperture in the base of the cavity forms an ink nozzle, and the ink channel is in fluid communication with the cavity.

A preferred method of forming the thin film pressure transducer comprises depositing a temporary island layer of an easily etched material on a predetermined area of the first side of the second substrate. A passivating layer is then deposited on the first side of the second substrate, covering and overlapping the temporary island layer of etchable material. A first electrically conductive layer is deposited on the passivating layer in the predetermined area and is patterned to form a first electrode. A layer of a piezoelectric material is then deposited on the first electrode. A second electrically-conductive layer is deposited on the piezoelectric layer and is patterned to form a second electrode. At least one air channel is formed in the second substrate, extending through the second substrate from the second side thereof to the temporary layer. The temporary layer is then removed, for example, by introducing an etchant through the air channel, to form an air chamber beneath the pressure transducer.

4. BRIEF DESCRIPTION OF THE DRAWING

The above and other aspects of our invention are described with reference to the following drawing figures.

5. DETAILED DESCRIPTION OF THE PREFERRED EMBODIMENT

Figure 1:
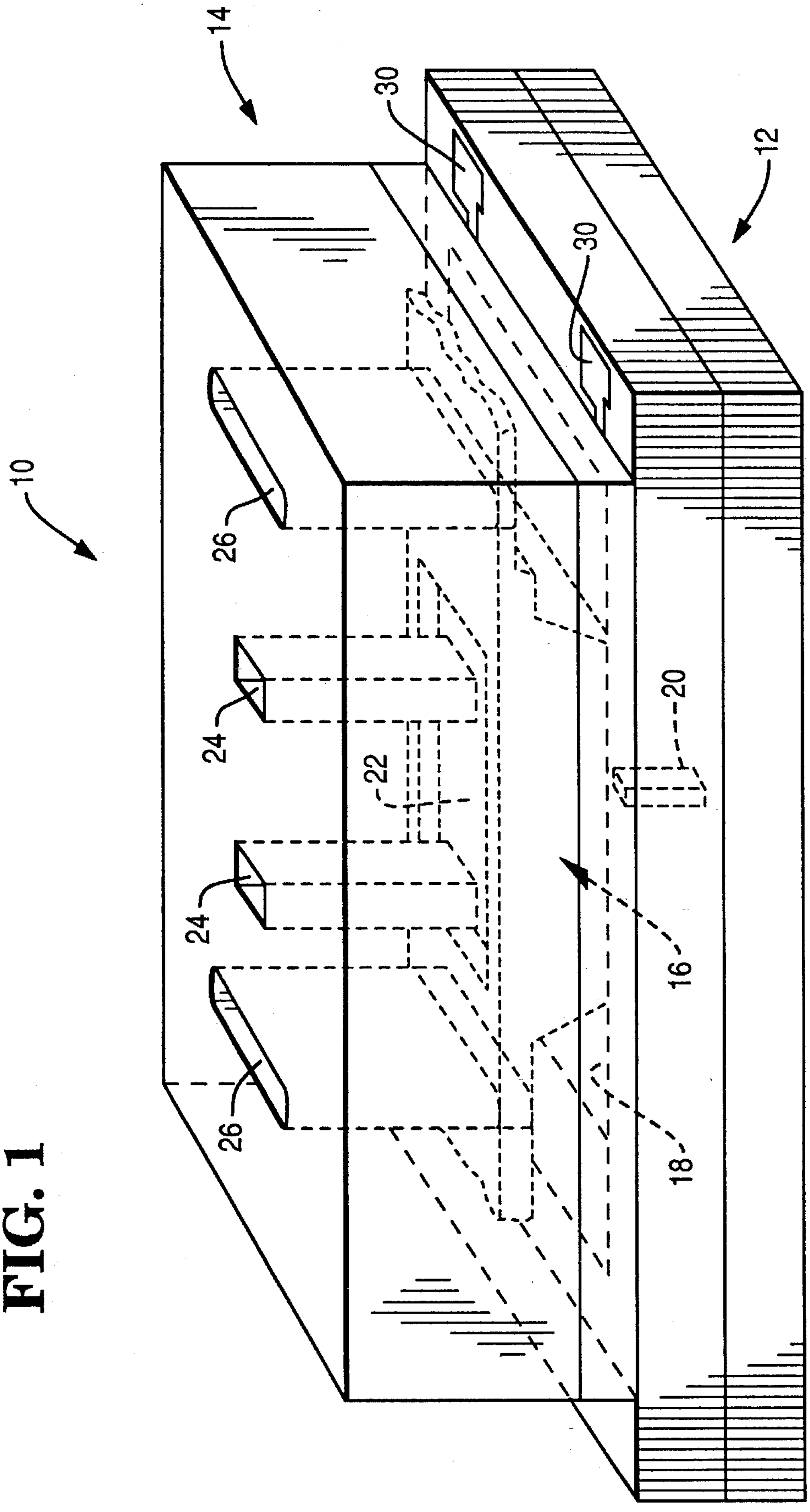
FIG. 1 is a perspective view schematically illustrating an ink-jet print head formed on and in first and second semiconductor substrates using semiconductor and electronic circuit fabrication techniques, in accordance with the present invention.

FIG. 1 is a simplified perspective view of one embodiment of an ink-jet print head 10 formed using semiconductor and electronic circuit fabrication techniques, in accordance with the present invention. The print head 10 comprises an ink reservoir unit 12 and an ink drive unit 14, which is bonded to the ink reservoir unit. The ink drive unit 14 includes a transducer 16, preferably a piezoelectric transducer, which, upon the application of an electrical potential, expands into an ink-filled reservoir 18 in the ink reservoir unit 12, thereby driving ink out of an aperture or ink nozzle 20, and onto a recording medium (not shown), such as paper.

The ink drive unit 12 is located adjacent an air chamber 22, which permits the transducer 16 to freely expand and contract. Two air channels 24 are provided, for allowing air to exit and enter the air chamber upon expansion and contraction of the transducer 16. Two ink channels 26, each in fluid communication with reservoir 18, are provided for replenishing the reservoir. The ink channels 26 are connected to ink supply means (not shown) for supplying ink to the ink reservoir 18. Two conductive lines 42*a* and 46*a* (see FIG. 7) run from electrodes 42 and 46, FIG. 7, formed on opposite sides of the transducer 16 to the exterior of the ink drive unit 14 where they form electrical contacts or pads 30. The transducer is driven by a AC power source (not shown) which is connected to electrical contact points 30.

Ink reservoir unit 12 and ink drive unit 14 are preferably formed on substrates having generally flat parallel sides. Features and components of the ink reservoir unit and the ink drive unit are formed using techniques well-known in semiconductor circuit manufacture, such as masking, etching, laser or electron beam drilling, vapor deposition, and liquid or vapor phase epitaxy. As such techniques are well-known, a detailed description of those techniques is not necessary to describe principles of the present invention and, accordingly, is not presented here. Also, when the word "pattern" or "patterned" is used, it is understood that conventional techniques such as masking and etching may be used to achieve the desired patterning or pattern.

Figure 2:
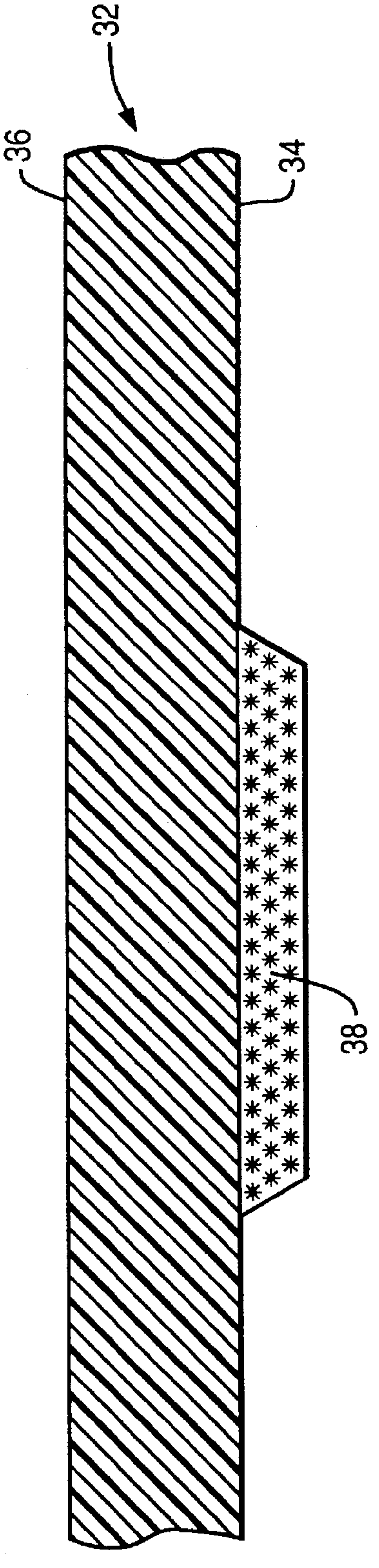
FIG. 2 is a cross-section view schematically illustrating the second substrate of FIG. 1 including a temporary island layer deposited on a first side thereof.

Referring now to FIG. 2, a substrate 32 for forming ink drive unit 14 has first and second generally flat, parallel sides 34 and 36 respectively. Substrate 32 is preferably a silicon wafer having a thickness of between about 400 μm and 600 μm.

A temporary or sacrificial layer 38 of a readily etched material such as oxide is deposited on an area of substrate 32 on side 34 to form an island. Island 38 preferably has a generally rectangular or circular outline, a surface area of between about 1E2 $\mu m^2$ and 1E6 $\mu m^2$, and a thickness between about 0.1 μm and 100 μm.

Figure 3:
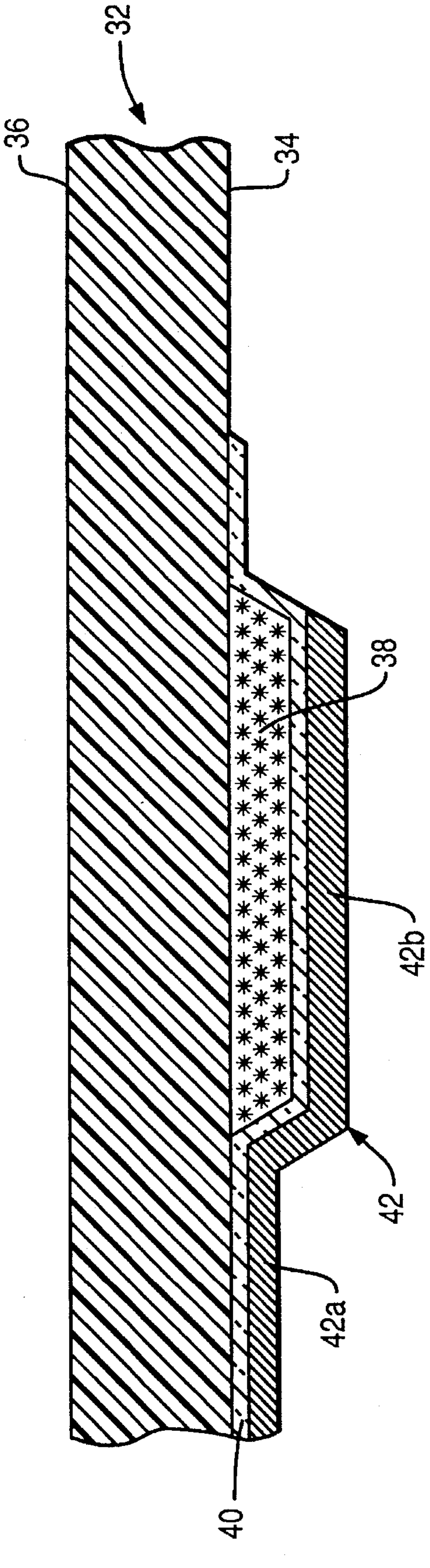
FIG. 3 is a cross-section view schematically illustrating the second substrate of FIG. 2 further including a passivation layer deposited over the temporary island layer and a first electrode deposited and formed on the passivation layer.

Next, as illustrated in FIG. 3, a layer 40 of an insulating material, for example, a chemical vapor deposited layer of silicon nitride, silicon oxynitride or silicon dioxide, is deposited on top of, and substantially overlapping, sacrificial island layer 38. Layer 40 preferably has a thickness between about 10 nm and 500 nm. A flexible, electrically conductive electrode layer 42 is then deposited over the insulating layer 40 covering the sacrificial island 38, and is patterned, using standard masking and etching techniques, to form a first electrode 42*b* for piezoelectric transducer 16, FIG. 1, on the layer 38 and overlapping the layer 38 on one side, and to form conductor line 42*a* which terminates in one of the contact pads 30, FIG. 1. Preferably layer 42 is formed from a metal or material such as gold, platinum, the stacked or dual film Pt/Ti, conductive oxide ($RuO_2$), silicide (platinum silicide (PtSi), titanium silicide (TiSi), cobalt silicide (CoSi), etc.) or nitride (TIN).

Figure 4:
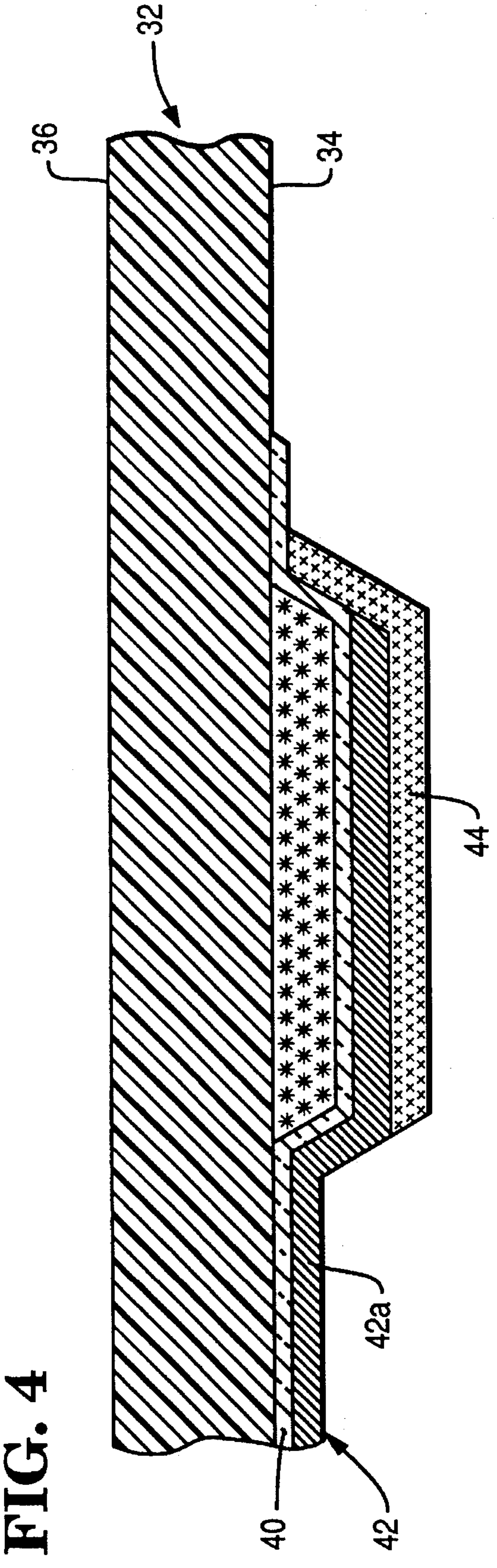
FIG. 4 is a cross-section view schematically illustrating the second substrate of FIG. 3 further including a piezoelectric layer deposited and formed on the first electrode.
Figure 5:
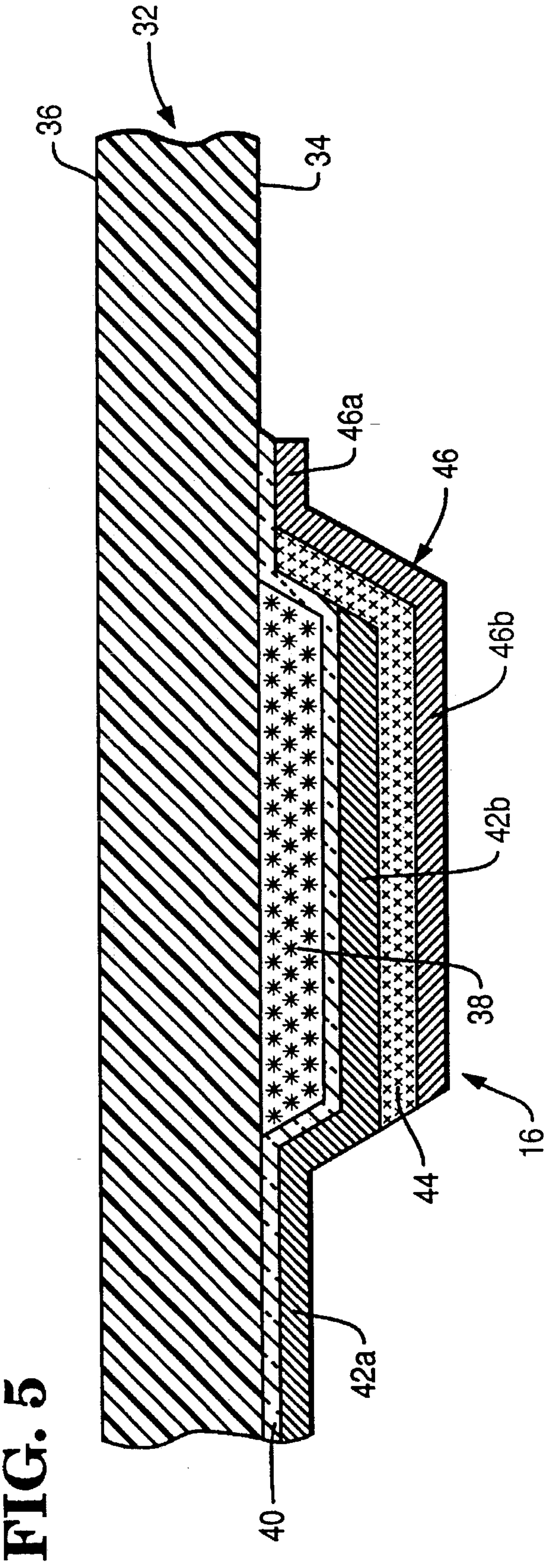
FIG. 5 is a cross-section view schematically illustrating the second substrate of FIG. 4 further including a second electrode deposited and formed on the piezoelectric layer, and with the first and second electrodes and the piezoelectric layer forming a pressure transducer.

Referring now to FIG. 4, an expandable layer 44 of a piezoelectric material such as $KNbO_3$, BMF (boron magnesium fluoride), PZT (lead zirconium titanate), or PLZT (lead lithium zirconium titanate) is deposited, for example, by the known sol-gel technique over first electrode layer 42 on top of temporary island-layer 38 and overlapping layer 38 on the side thereof opposite conductor line portion 42*a* of the electrode 42. Layer 44 preferably has a thickness of between about 100 nm and 4000 nm. Next, as shown in FIG. 5, a second flexible electrically conductive layer 46 is deposited over piezoelectric layer 44 and patterned, forming a second electrode 46*b* for piezoelectric transducer 16 and forming a conductor line 46*a* overlapping layer 44 on the side thereof opposite portion 42*a* of layer 42. The electrode 46*b* terminates in the second one of the contact pads, FIG. 1. At this point the functional components of transducer 16 are completed.

Figure 6:
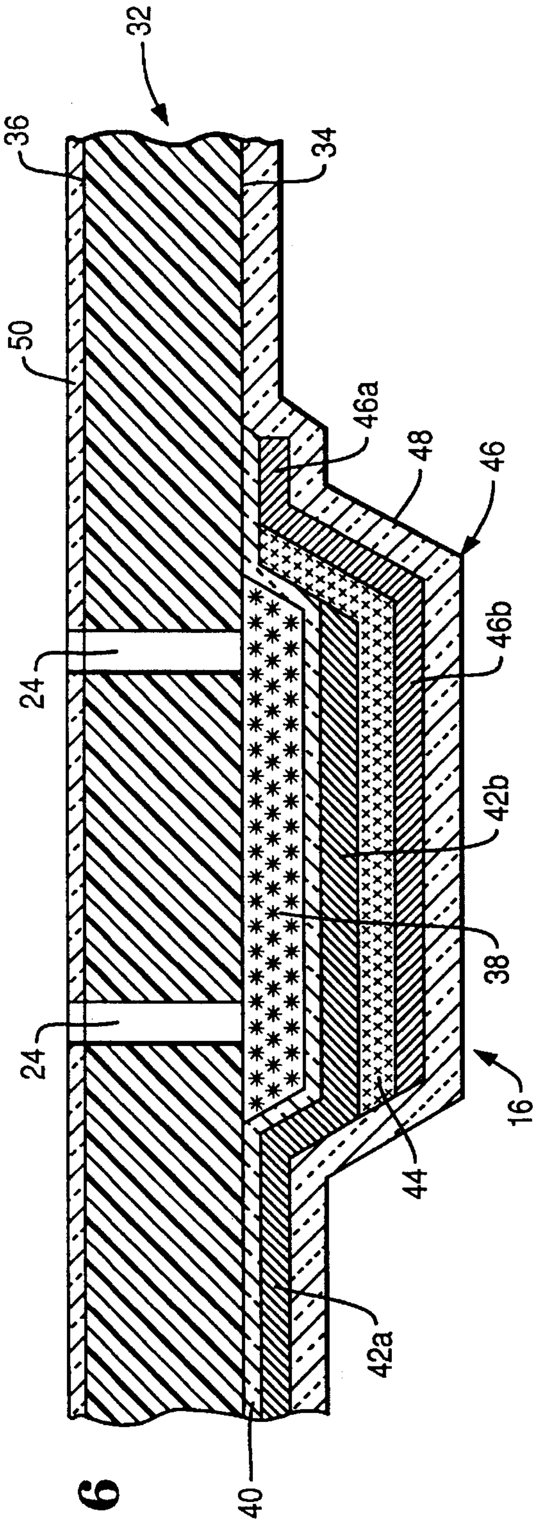
FIG. 6 is a cross-section view schematically illustrating the second substrate of FIG. 5 further including a passivation layer deposited over the second side of the substrate and a passivation layer deposited over the first and second electrodes, and further including two air channels extending through the substrate to the temporary film.

Referring to FIG. 6, after completing the functional elements of the piezoelectric transducer 16, substrate 32 is preferably coated with passivating or insulating layers 48 and 50 on sides 34 and 36 respectively. Layer 48 substantially overlaps transducer 16, including the conductor line portions 42*a* and 46*a* of electrode-layers 42 and 46. Following the deposition of the passivating layers 48 and 50, at least one and preferably two air channels 24 are formed in substrate 32, for example, by laser drilling. The air channels 24 extend through substrate 32 from side 36 to side 34 to contact sacrificial island layer 38. The air channels have a square (or circular) section as depicted in FIG. 1, the square (circular) section being between about 10 μm and 500 μm on a side (in diameter).

Figure 7:
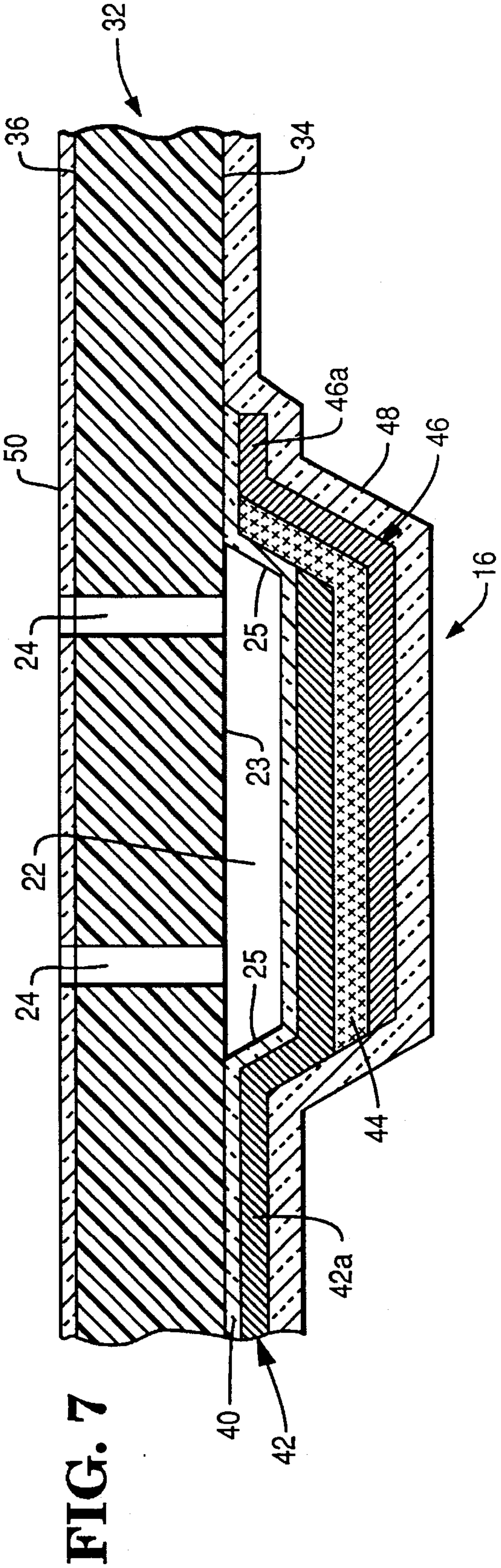
FIG. 7 is a cross-section view schematically illustrating the second substrate of FIG. 6, from which the temporary layer has been removed by etching to form an air gap immediately adjacent the pressure transducer.

Formation of ink drive unit 14 is continued by removing temporary island-layer 38, for example, by introducing a wet (liquid) etchant to the layer via one or both of air channels 24. As illustrated in FIG. 7, when layer 38 is removed, air gap or air chamber 22 (see also FIG. 1) is formed on side 34 of substrate 32 immediately adjacent transducer 16. The air chamber 22 has a top 23 and sides 25 formed by passivation layer 40, and is in fluid communication with side 36 of substrate 32 via air channels 24. Air chamber 22 provides, in effect, an air cushion which allows piezoelectric layer 44 to expand and contract freely under an electrical potential applied to the layer.

Figure 8:
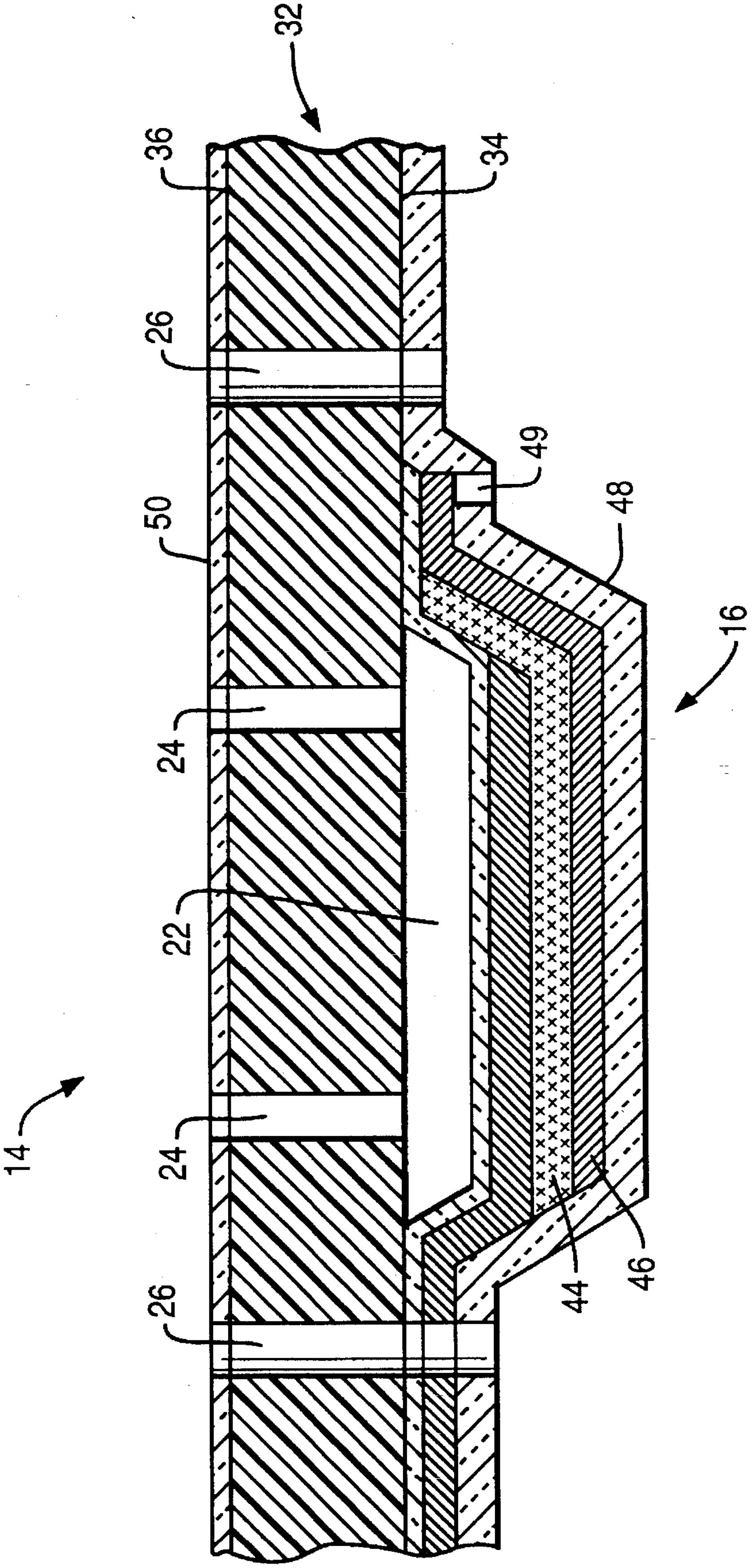
FIG. 8 is a cross-section view schematically illustrating the second substrate of FIG. 7 further including two ink channels extending through the substrate.

Referring now to FIG. 8, the formation of ink drive unit 14 is completed by forming at least one, and preferably two, ink channels 26 in substrate 32, for example by laser drilling or etching. The ink channels 26 preferably have a slit-like horizontal cross-section as illustrated in FIG. 1, the slit being between about 100 μm and 2000 μm long and between about 10 μm and 500 μm wide. The ink channels 26 extend through substrate 32 from side 36 to side 34. Additionally, passivating layer 48 may have a portion thereof etched away to form an aperture therein, such as aperture 49, for making contact to the second electrode 46. A similar aperture (not shown) may be etched in layer 48 for making contact to the first electrode 42.

Figure 9:
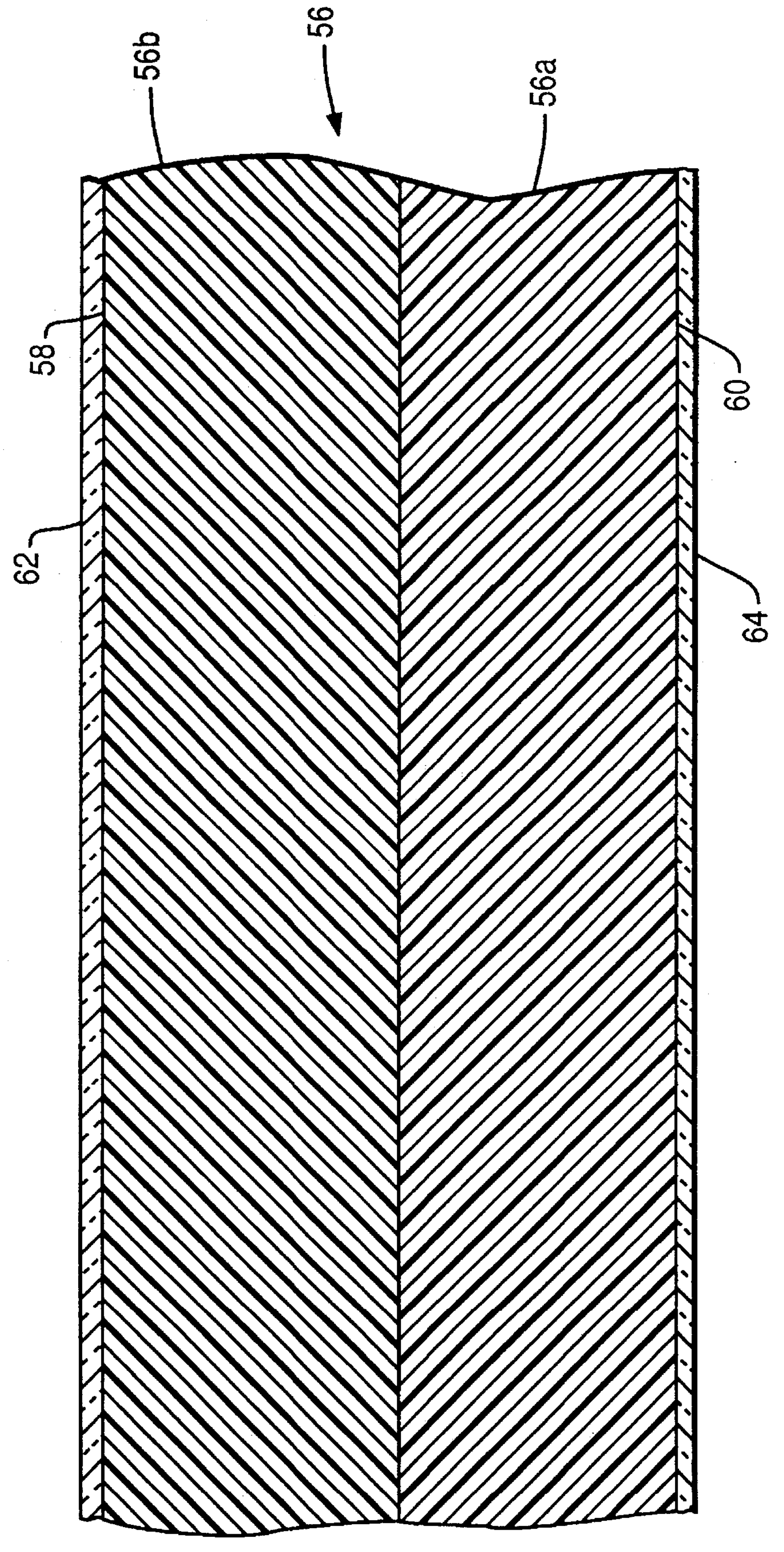
FIG. 9 is a cross-section view schematically illustrating the first substrate of FIG. 1 including a heavily doped region and a lightly doped region and including a passivation layer on the first and second sides of the substrate.

Continuing now with a description of a preferred method for forming reservoir unit 12, FIG. 9 depicts a substrate 56, having generally flat parallel sides 58 and 60. Substrate 56 is preferably silicon and comprises a lightly doped base 56*a*, which may be, for example, a monocrystalline silicon wafer, and a heavily doped region 56*b* which may be formed on the wafer by epitaxial deposition. Substrate 56 preferably has a total thickness of between about 10 mils and 40 mils. Heavily doped region 56*b* preferably has a thickness between about 1 mil and 5 mils. Substrate 56 preferably has insulating or passivating layers 62 and 64 deposited on the opposite major surfaces 58 and 60 respectively.

Figure 10:
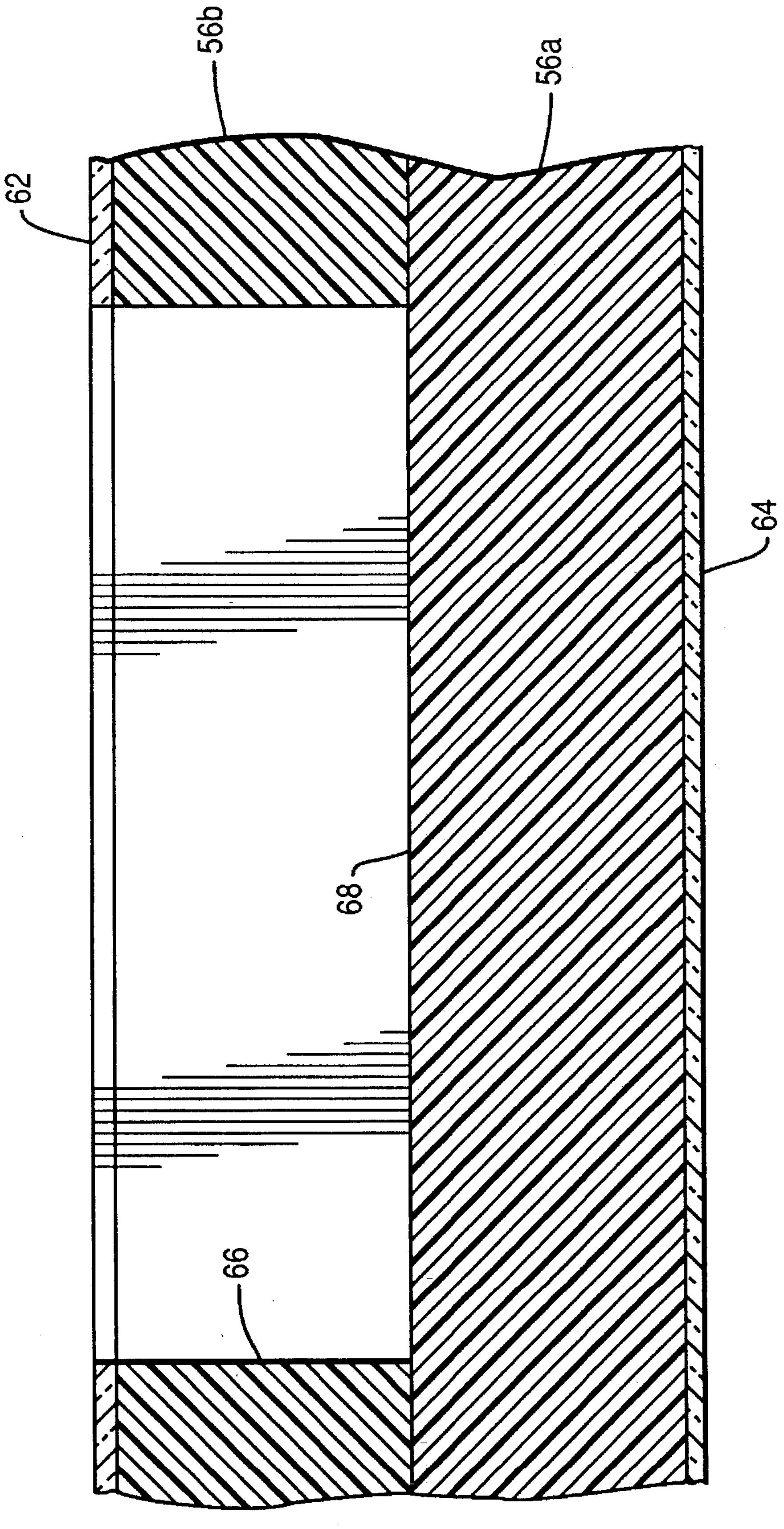
FIG. 10 is a cross-section view schematically illustrating the first substrate of FIG. 9 including a cavity formed in the substrate on the one side thereof.

Referring now to FIG. 10, a cavity 66 is formed in the substrate 56, for example, by etching through passivation layer 62 and preferably completely through the epitaxial, heavily doped region 56*b* of substrate 56, such that the base 68 of the cavity is formed by lightly doped region 56*a*. The two regions of substrate 56 having different doping levels allow the use of an etchant such as KOH which will differentially or selectively etch the relatively highly doped region 56*b* of the substrate at a much faster rate than lightly doped region 56*a*, allowing the depth of cavity 68 to be conveniently controlled by the depth of highly doped epitaxial region 56*b*, i.e., by the thickness of the layer forming the heavily doped region.

Figure 11:
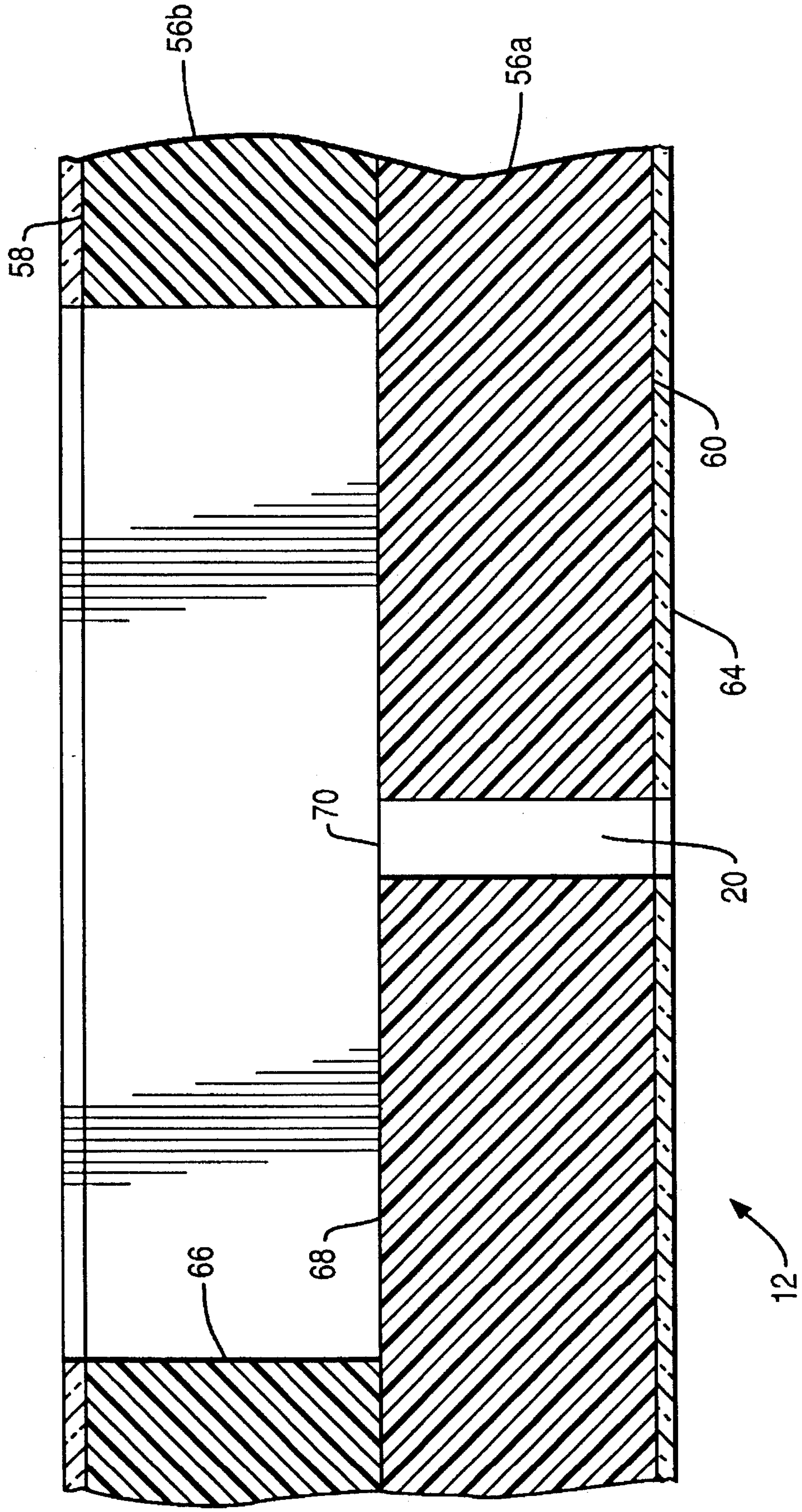
FIG. 11 is a cross-section view schematically illustrating the first substrate of FIG. 10 further including an aperture extending through the substrate from the base of the cavity to the second side of the substrate.

After forming cavity 68 in side 58 of substrate 56, an aperture 70 is etched or laser drilled in the base 68 of the cavity 66 as depicted in FIG. 11. Aperture 70 extends through substrate 56 to side 60 thereof to form ink nozzle 20. Nozzle 20 preferably has a circular section as illustrated in FIG. 1, the nozzle having a size between about 5 μm and 100 μm and preferably about 20 μm.

Figure 12:
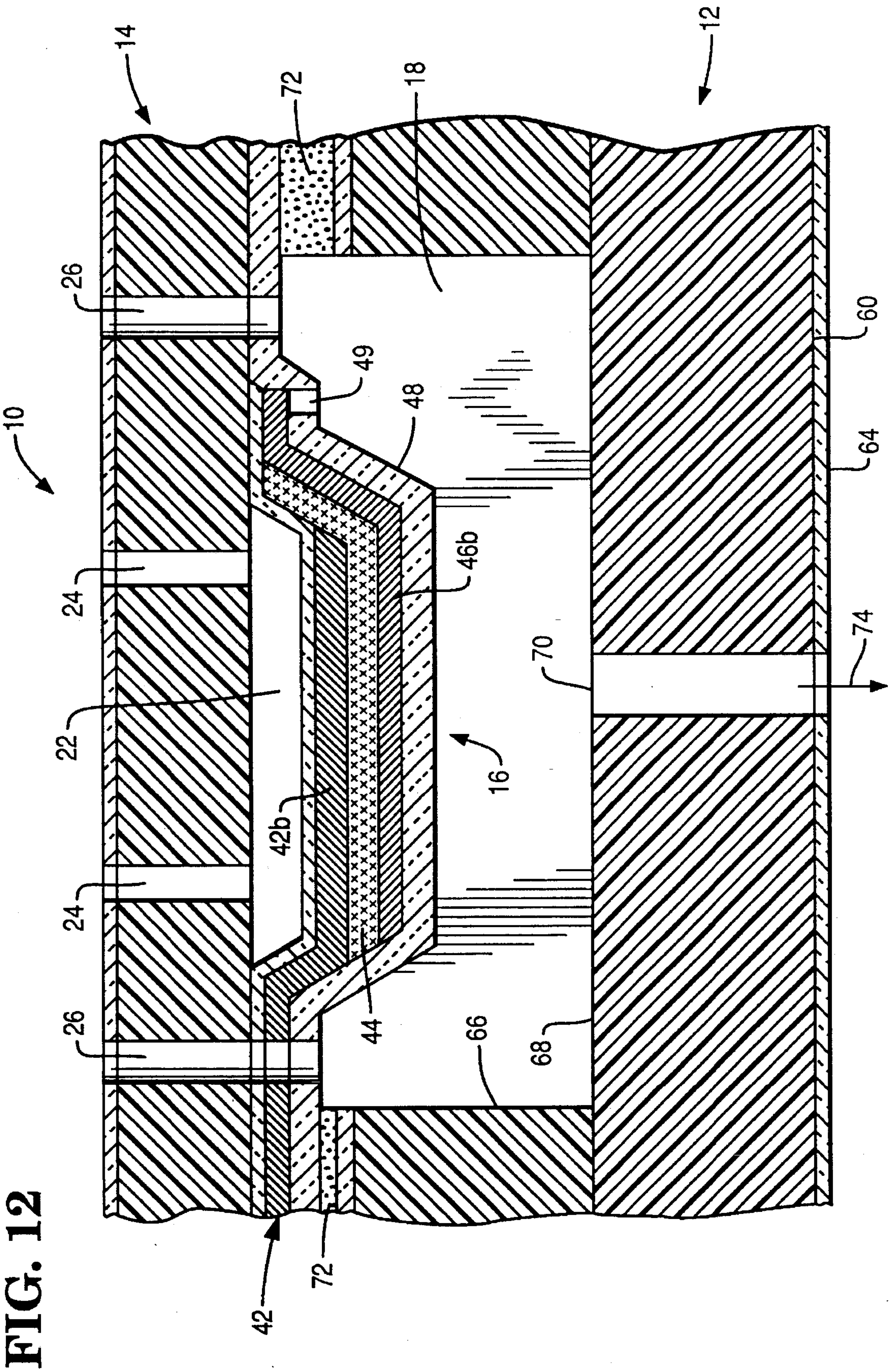
FIG. 12 is a cross-section view schematically illustrating the bonded print head assembly of the substrate of FIG. 8 and the substrate of FIG. 11.

Referring now to FIG. 12, print head 10 is assembled by bonding together ink drive unit 14 and ink reservoir unit 12, i.e, by bonding together substrates 32 and 56 with sides 34 and 58 thereof in a face-to-face relationship. The units are bonded together such that transducer 16 is within cavity 66, ink channels 26 are in fluid communication with cavity 66, and substrate 32 (and layers thereon) encloses cavity 66 to form ink reservoir 18. As such, when transducer 16 is operated by applying a suitable electrical potential via contacts 30, FIG. 1, to electrodes 42*b* and 46*b* and across piezoelectric layer 44, ink (not shown) is expelled from the reservoir in the form of droplets through nozzle 20 as indicated by arrow 74 to impact a recording medium (not shown). A suitable adhesive for bonding units 12 and 14 is low temperature glass. The adhesive is depicted as layer 72 in FIG. 12.

The print head 10 of the present invention has been depicted for convenience of description as comprising only one reservoir and one ink nozzle. As discussed above, however, it is usual in a print head to provide a line of nozzles or an array of nozzles each equipped with an ink reservoir, and a means of supplying ink to the reservoirs.

It will be evident to one familiar with the art to which the invention pertains that the above-described method steps for forming one reservoir and one nozzle may be carried out simultaneously, in different locations on substrate 32, to provide an array of transducers and ink channels, and carried out simultaneously on substrate 56 to produce a corresponding array of ink nozzles and ink reservoirs. Such a procedure would be similar to procedures in which semiconductor circuit features are repeated over the surface of a silicon wafer to build a complex information processing circuit. Thus, by using masking and feature formation techniques as practiced in semiconductor device manufacture, alignment and spacing accuracy for a nozzle array similar to that currently achieved in aligning circuit features and components in semiconductor device manufacture may be achieved. Further, by forming all reservoirs and nozzles in a particular nozzle array on a common substrate, the nozzles are, in effect, automatically arranged in the same plane, that plane being defined by a surface of the substrate on which the nozzles are located.

The present invention has been described in terms of a preferred embodiment. The invention however is not limited to the embodiments described and depicted. Rather, the scope of the invention is defined by the appended claims.

What is claimed is:

1. A method for forming a print head for an ink-jet printer, comprising the steps of:

(a) providing first and second semiconductor substrates each thereof having first and second sides;

(b) etching a cavity having a base in the first side of the first substrate;

(c) forming an aperture in the first substrate extending from the base of the cavity to the second side of the first substrate;

(d) forming a thin film electrical transducer on the first side of the second substrate;

(e) forming at least one ink channel through the second substrate adjacent the transducer; and (f) bonding the first and second substrates together with the first sides thereof in a face-to-face relationship with the transducer within the cavity and with the at least one ink channel in fluid communication with the cavity, whereby the second substrate encloses the cavity to form an ink reservoir, the aperture in the base of the cavity forms an ink nozzle, the transducer provides a means of expelling ink from the ink reservoir through the ink nozzle, and the ink channel provides a means of replenishing the ink reservoir.

2. The method of claim 1, wherein the first substrate comprises a semiconductor base having an epitaxial region formed thereon and wherein the cavity is formed by etching the epitaxial region differentially relative to the base.

3. The method of claim 1 wherein the transducer is formed by:

(g) forming on a predetermined area of the first side of the second substrate a temporary island layer of an etchable material;

(h) forming a passivating layer on the first side of the second substrate, the passivating layer covering the temporary island-layer;

(i) forming on the passivating layer in the predetermined area a first electrically-conductive layer for forming a first electrode for the transducer;

(j) forming on the first electrically conductive layer a layer of a piezoelectric material; and (k) forming on the layer of piezoelectric material a second layer of an electrically-conductive material to form a second electrode for the transducer; and further comprising:

(l) forming in the second substrate at least one air channel, the air channel extending through the second substrate from the second side thereof to the temporary island-layer; and (m) introducing an etchant through the at least one air channel, thereby removing the temporary island layer and forming an air chamber immediately adjacent the transducer.

* * * * *